Jan. 17, 1956 G. C. SZIKLAI ET AL 2,731,567

TRANSISTOR RELAXATION OSCILLATOR

Filed Oct. 31, 1952

INVENTORS.
George C. Sziklai &
Winthrop S. Pike

BY H. C. Newton

ATTORNEY

United States Patent Office 2,731,567

Patented Jan. 17, 1956

2,731,567

TRANSISTOR RELAXATION OSCILLATOR

George C. Sziklai and Winthrop S. Pike, Princeton, N. J., assignors to Radio Corporation of America, a corporation of Delaware Application October 31, 1952, Serial No. 317,854

16 Claims. (Cl. 250—36)

Figure 2:
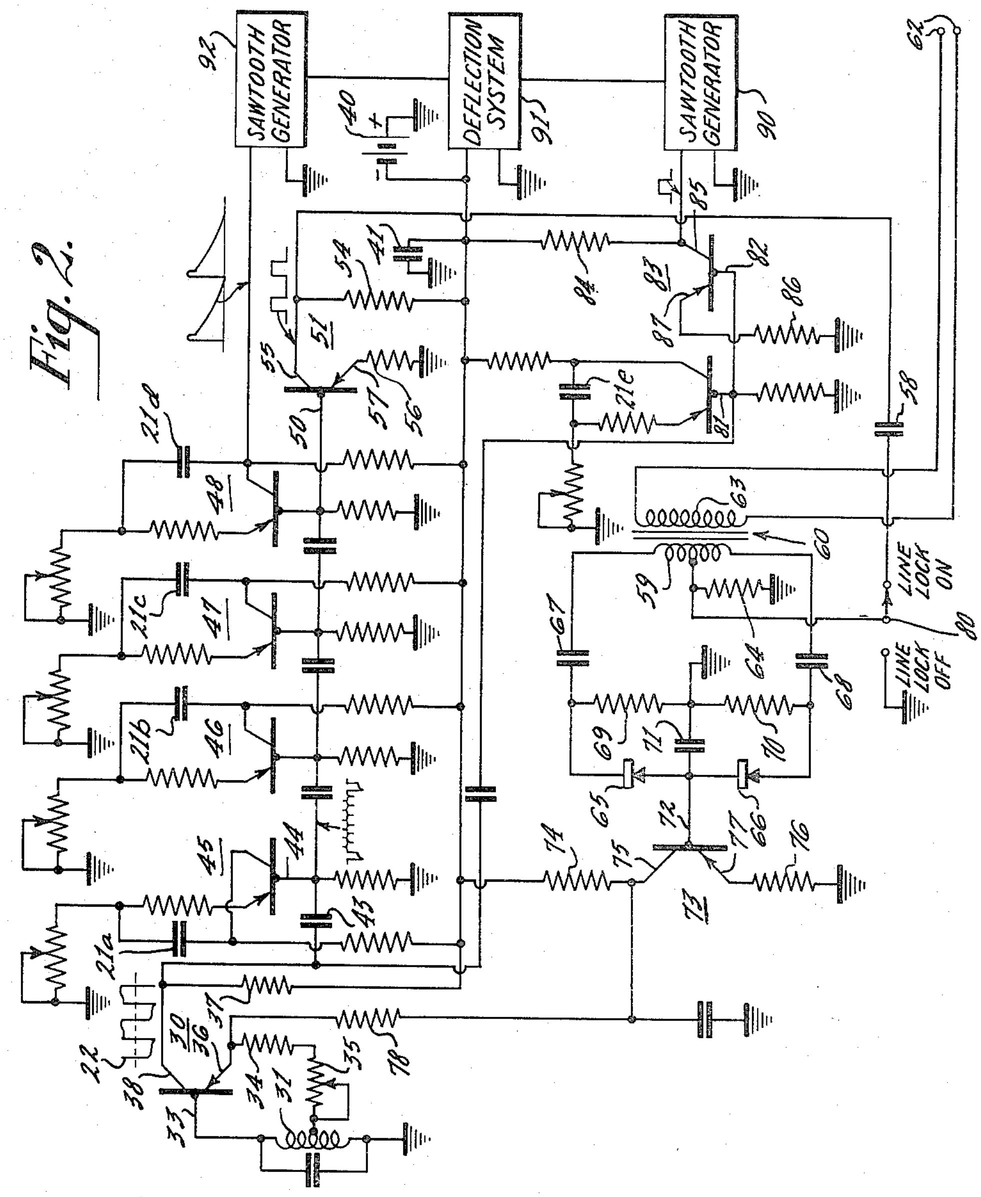

This invention relates generally to oscillator circuits and particularly relates to relaxation oscillator circuits employing semi-conductor devices.

A relaxation oscillator circuit may be defined as one in which the frequency is controlled by the charge or discharge of a capacitor through a resistor. A species of the relaxation oscillator is that in which the frequency controlling element such as a capacitor is charged through one impedance element and discharged through another.

An example of this type of circuit, utilizing electron discharge devices, is shown and described in U. S. Patent 2,157,434 issued May 9, 1939 to James L. Potter for Oscillator Circuit. This circuit requires the cooperative use of two electron discharge devices.

The amplifier devices utilized in the circuit embodying the present invention are semi-conductor devices, each of which may comprise a semi-conductive body having a plurality of electrodes in contact therewith. The application of semi-conductor devices to relaxation oscillator circuits is shown in general in the "RCA Review," December 1949, pages 459–476 in an article entitled "Counter Circuits Using Transistors" by Eberhard et al. However, some consideration of the basic facts and principles as well as the terminology relating to such devices may be best given at this point in order to facilitate a better understanding of the present invention.

In semi-conductive materials such as germanium or silicon the electrical currents, according to presently accepted theory, are carried by electrons designated as excess electrons or by holes which are a deficiency in electrons. According to the theory, holes may be viewed as carriers of positive electric charges.

The conductivity of a semi-conductive material is called excess N type when the mobile charges normally present in excess in the material under equilibrium conditions are electrons. N type semi-conductive material is also one which passes current easily when the semi-conductive material is negative with respect to a conductive connection thereto.

The conductivity of a semi-conductive material is called defect or P type when the mobile charges normally present in excess in the material under equilibrium conditions are holes. P type semi-conductive material passes current easily when the semi-conductive material is positive with respect to a conductive connection thereto.

Furthermore, two distinct classes of semi-conductor devices have been developed which have been referred to as the junction transistor and the point contact transistor.

The point contact transistor comprises a semi-conductive body having a pair of pointed electrodes in high-resistance or rectifying contact therewith and a third electrode in low-resistance or ohmic contact therewith. The electrodes which are in rectifying contact with the semi-conductive body have been termed the emitter electrode and the collector electrode. The electrode which is in low-resistance contact with the semi-conductive body has been termed the base electrode. The semi-conductive body, of course, may be either N type or P type semi-conductive material as above described.

The terms forward bias and reverse bias have been applied to the transistor art in the same manner as they have been used in the rectifier art, that is, a forward bias means that the electrode is biased in the direction of easy current flow and a reverse bias means that the electrode is biased in the direction of difficult current flow. The collector electrode of a transistor is generally considered the output electrode and is usually biased in a reverse direction. Due to this bias, the output impedance of the transistor is fairly high and may be in the order of 10,000 ohms or more. The emitter electrode may at the same time be biased in either the forward or reverse direction depending on the particular type of operating characteristics that are desired.

It has been found that the operating characteristics of a transistor when referred to any one of the electrodes, contains a negative resistance portion bounded at either end by a positive resistance portion. Due to this negative resistance portion of the transistor characteristic, it is possible to operate a transistor in a circuit which will provide monostable, bistable or astable operation, depending upon the particular values of circuit elements utilized and the static bias applied to the transistor electrodes.

It is an object of the present invention to provide a transistor relaxation oscillator or signal wave generator which in operation is capable of producing an output signal having a sawtooth wave form, a pulse wave form or a combination thereof.

It is a further object of the present invention to provide a transistor relaxation oscillator circuit utilizing a minimum of circuit elements, which is stable in operation, and which is adjustable to provide a desired output wave form in the signal delivered thereby.

It is another object of the present invention to provide a stable transistor relaxation oscillator circuit which in operation is capable of providing an output signal having a sawtooth wave form while utilizing a minimum of circuit elements.

It is still a further object of the present invention to provide a stable transistor relaxation oscillator circuit which may readily be synchronized by the application of synchronizing pulses thereto.

A relaxation oscillator in accordance with the present invention may include a transistor circuit arranged to be monostable. A storage element such as a capacitor is charged through an external circuit including the collector electrode load impedance and a degenerative emitter electrode impedance, while the transistor is in a stable state of low current conduction. The storage capacitor is discharged through the transistor when, due to the circuit condition as the capacitor becomes charged, the transistor circuit is triggered temporarily into an unstable high current conduction state.

Figure 1:
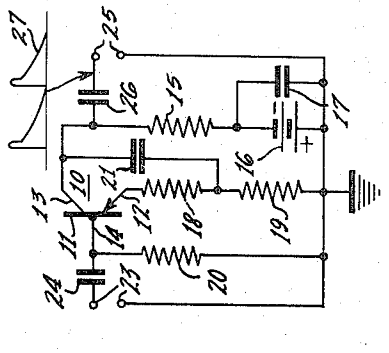

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1 is a schematic circuit diagram of a transistor relaxation oscillator circuit embodying the present invention; and Figure 2 is a schematic circuit diagram of a portion of a television transmitter having a frequency divider system provided with an oscillator circuit embodying the invention.

Referring now to the drawing, in which like elements throughout are designated by the same reference characters, and with particular reference to Figure 1, the relaxation oscillator circuit includes a transistor 10, which preferably is of the current multiplication type and which also may be of the point contact type as shown by way of example. The body 11 may consist of a semi-conductive material such as germanium and preferably is of the N type as will be assumed in the following discussion. An emitter electrode 12, a collector electrode 13 and a base electrode 14 are in contact with the semi-conductive body 11. The details of construction and the general mode of operation of a point contact transistor are well known and need not further be discussed, as not specifically relating to the invention.

A collector electrode load resistor 15 is connected between the collector electrode 13 and the negative terminal of a sourc of D. C. voltage or biasing potential, such as a battery 16, having its positive terminal grounded. The battery 16 may be bypassed for alternating or signal currents by a bypass capacitor 17. The emitter electrode 12 is connected to ground and hence, to the positive terminal of the battery 16 through the series arrangement of a current limiting resistor 18 and a bias resistor 19. A direct current path is provided for the base electrode 14 by a base resistor 20 connected between the base electrode 14 and ground.

Operation of the above described circuit as an oscillator or signal wave generator is affected by the charge and discharge of an electrical storage element which is shown as a storage capacitor 21 connected between the collector electrode 13 and the junction of the current limiting resistor 18 and the bias resistor 19. As will be more fully discussed hereinafter, the circuit may, for example, be triggered or synchronized by the application of a negative trigger pulse to the input terminals 23, one of which is connected to the base electrode 14 through a coupling capacitor 24, the other of which is connected directly to ground.

An output signal may be derived across the collector electrode load resistor 15. To this end, a pair of output terminals 25 are provided, one of which is connected to the collector electrode 13 through a coupling capacitor 26, and the other of which is grounded.

The above described circuit can be either monostable or astable depending on the static bias conditions. However, the following discussion of the operation will be limited to astable operation.

Let it be assumed, for example, that the transistor circuit of Figure 1 is in a stable state of low current conduction. Let it further be assumed that the storage capacitor 21 is in an initially uncharged condition. The current through the bias resistor 19 is then the sum of the charging current and the emitter electrode current of the transistor. The current through the load resistor 15 will be the sum of the charging current and the collector electrode current. The current through the current limiting resistor 18 will, however, be only the emitter electrode current.

With this condition of operation, a voltage is developed across the bias resistor 19 and the current limiting resistor 18, which is applied between the base electrode 14 and the emitter electrode 12 and is in a direction such as to maintain the transistor circuit in a stable low current conduction state. However, as the storage capacitor 21 becomes charged, the charging current decreases. Consequently, the collector electrode 13 becomes more negative and the voltage existing between the base electrode 14 and the emitter electrode 12 is reduced.

This change in the bias condition temporarily triggers the transistor circuit into an unstable high current conduction state, thereby providing a discharge path for the storage capacitor 21 through the current limiting resistor 18, the emitter electrode 12 and the collector electrode 13 of the transistor 10.

It can be seen that the high transistor current through the bias resistor 19, and the storage capacitor 21 discharge current through the current limiting resistor 18, are in the same direction and are additive to produce a voltage drop which is effectively applied between the emitter electrode 12 and the base electrode 14 in such a direction as to restore the transistor circuit to its initial stable low current conduction state. Further, the high transistor current which flows through the load resistor 15 causes the collector electrode 13 to become less negative or more positive.

These conditions coupled with the fact that the high current condition is an unstable one, causes the transistor circuit to return to its initial stable low current conduction state, whereupon the charging cycle begins again and the action above described is cyclically repeated at a predetermined rate.

It has been found that the output wave form of the transistor oscillator circuit shown in Figure 1 is a composite of a pulse and a sawtooth wave as shown by the curve 27 of the graph indicated at the output terminals 25. It has also been found that by increasing the resistance ratio of the bias resistor 19 with respect to the load resistor 15, the pulse amplitude can be increased with respect to the sawtooth component. It has also been found that the collector voltage may be changed, for example, from 22.5 volts to 45 volts with a present available point contact transistor, without affecting the operation of the circuit.

The following values of circuit elements for use with the point contact transistor type shown, are given by way of example only and are not to be considered as limiting the scope of the present invention:

| | | |
|---|---|---|
| Base resistor 20 | ohms | 620 |
| Bias resistor 19 | do | 5,000 |
| Current limiting resistor 18 | do | 510 |
| Load resistor 15 | do | 12,000 |
| Storage capacitor 21 | microfarads | 0.01 |
| Battery 16 | volts | 35 |

It has been found that a circuit constructed in accordance with one embodiment of the present invention and utilizing the above specified circuit elements produced on output wave form substantially as shown by the curve 27. It has further been found, however, that if the bias resistor 19 is increased and the load resistor 15 is decreased so that the above shown ratio is reversed, the output wave form will be substantially a sharp vertical pulse. It has further been found that if the two above-identified resistors were selected to be substantially equal, the output wave form would consist of a combination of a sawtooth and a pulse, each of substantially equal magnitude.

With further reference to the point contact transistor referred to, the values shown in the above table were obtained while utilizing the RCA TA 165 N type point contact transistor. It is obvious that the circuit values would be changed somewhat with other types of transistors.

It has been indicated that a relaxation oscillator circuit embodying the invention could be synchronized by the application of a negative pulse to the base electrode. If the base electrode is driven negatively with respect to the emitter electrode at a time during the charging cycle, which is prior to the time when the relaxation oscillator circuit would, by regenerative action, cause the circuit to go temporarily into an unstable high current conduction state, it will be triggered into the high current state by the pulse. In other words, if the frequency of the relaxation oscillator circuit is slightly below the frequency at which it is desired to synchronize the relaxation oscillator circuit, a negative pulse applied to the base electrode will trigger the relaxation oscillator circuit slightly ahead of its normal reaction time and will consequently cause the relaxation oscillator circuit to have a slightly higher frequency than it would have without these trigger pulses. When the relaxation oscillator is normally operating at a submultiple of the applied trigger pulses, a stable frequency divider circuit is provided.

This frequency dividing ability is utilized in the circuit illustrated in Figure 2 which includes a transistor 30, which is connected as a sine wave oscillator circuit as is described in the "RCA Review," March, 1949, Vol. X, No. 1 in an article entitled "Some Novel Circuits For the Three Terminal Semi-Conductor Amplifier" by Webster et al. A parallel resonant tuned circuit including an inductor 31 and a capacitor 32 is connected between the base electrode 33 and ground. The operating bias for the oscillator circuit is selected by means of a fixed resistor 34 and a variable resistor 35 connected in series arrangement between the emitter electrode 36 and a tap on the inductor 31.

Operating potentials for the circuit are provided through a resistor 37 which is connected between the collector electrode 38 and a source of voltage illustrated as a battery 40, one terminal of which is grounded. The battery 40 may be bypassed at signal frequencies by a bypass capacitor 41.

In the arrangement as illustrated, the frequency of the oscillator circuit is selected to be twice the horizontal frequency of the deflection system which is to be controlled.

The output wave form of the oscillator is substantially as illustrated by the curve 42 shown at the collector electrode 38. The output signal of the oscillator is coupled through a coupling capacitor 43 to the base electrode 44 of the first of four cascaded transistor frequency divider stages designated generally at 45, 46, 47 and 48. It is noted that the coupling capacitor 43 and its associated resistors act as a differentiating network for the oscillator output signal. The frequency divider stage 45 may be considered by way of example, to operate at one seventh the frequency of the oscillator. This operation is affected by the appropriate selection of the value of the storage capacitor 21*a*.

The signal output of the frequency divider stage 45 is coupled through a coupling capacitor 49 to the frequency divider stage 46 which, by appropriate selection of the storage capacitor 21*b*, operates at one fifth the frequency of the frequency divider stage 45. As was above stated, these pulses of the first frequency divider stage 45 are at a frequency which is one seventh of the frequency of the oscillator circuit. This second frequency divider stage 46 designed to operate at one fifth of the frequency of the first frequency divider stage 45 will then be synchronized with the first frequency divider stage 45 at one fifth of its frequency.

The third and fourth frequency divider stages 47, 48 are respectively adjusted as above, to divide by five and to divide by three. Accordingly, the signal output at the collector electrode of the fourth relaxation oscillator stage in the example under discussion, is a sixty cycle sawtooth wave.

This output is directly coupled to the base electrode 50 of a transistor amplifier stage comprising a point contact transistor 51. Operating potentials for the amplifier stage are provided by a load resistor 54 connected between the collector electrode 55 and the negative terminal of the battery 40. The base electrode emitter electrode bias is supplied by a bias resistor 56 connected between the emitter electrode 57 and ground. The output of the amplifier stage is coupled to a phase comparator circuit through a coupling capacitor 58 connected between the collector electrode 55 and the center tap of the secondary winding 59 of a transformer 60.

The frequency standard with which the signal output from the collector electrode 55 is compared may be supplied from a commercial 60 cycle source for which a pair of input terminals 62 are provided and connected to the primary winding 63 of an input coupling transformer 60. Across the secondary winding 59 of the transformer there is thus provided a voltage which is of the frequency of the voltage applied to the terminals 62. The center tap of the secondary winding 69 is connected to ground through a resistor 64 across which is developed the output voltage from the collector electrode 55 of the amplifier stage. It thus can be seen that the amplifier voltage which is developed at a given frequency across the resistor 64 and the voltage which is developed at a standard or known frequency across half of the secondary winding 59 will be in additive relation and will produce a resultant voltage depending on the phase relation between the output signal of the amplifier and the standard frequency signal. This resultant voltage is applied to a pair of rectifiers 65, 66 which may be germanium diodes, through a pair of coupling capacitors 67, 68 respectively. Each of the rectifiers 65 and 66 is provided with a load resistor 69 and 70 respectively.

A resultant direct current voltage, therefore, will appear across the filter capacitor 71 which is connected between the junction of the diodes 65, 66 and ground. The magnitude of this direct current voltage depends upon the phase relation of the voltage derived from the collector electrode 55 and the standard voltage applied to the input terminals 62.

This direct current voltage is applied to the base electrode 72 of a P–N–P junction transistor 73, which is used as a direct current amplifier. Operating voltages are applied to the transistor 73 through a collector load resistor 74 connected betwen the negative terminal of the battery 40 and the collector electrode 75. A bias resistor 76 is connected between the emitter electrode 77 and ground.

The amplified direct current voltage is coupled to the emitter electrode 36 of the oscillator stage through an isolating resistor 78. The direct current voltage variations, which are thus applied to the emitter electrode 36 of the oscillator stage, cause the frequency of the oscillator stage to vary. Accordingly, the frequency of the oscillator stage is controlled in accordance with the frequency standard applied to the input terminals 62.

It is noted that the center tap of the secondary winding 59 is also connected to a single-pole double-throw switch 80 which is provided to enable the phase comparator circuit to be connected or disconnected from the frequency divider chain depending on whether or not synchronization is desired.

The collector electrode signal output of the oscillator circuit is also applied to the base electrode 81 of another frequency divider stage which includes a frequency determining element 21*e*. This frequency divider stage is designed to operate at one half of the frequency of the oscillator circuit. It is noted that this stage is substantially identical to the frequency divider stages 45, 46, 47 and 48 except in the selection of the frequency determining element or storage capacitor.

The output of this frequency divider stage is directly coupled to the base electrode 82 of a point contact transistor 83 which is utilized to amplify the output signal of the frequency divider stage. Direct current operating potentials are provided for the transistor 83 through the collector load resistor 84 connected between the negative terminal of the battery 40 and the collector electrode 85. Biasing for the transistor 83 is provided by a biasing resistor 86 connected between the emitter electrode 87 and ground.

The signal output of this transistor oscillator stage is coupled to a sawtooth generator 90 which may be of any convenient form and which is designed to operate at the horizontal sweep frequency of the system.

The signal output of the sawtooth generator 90 is coupled to the deflection system 91 which, of course, may be any appropriate type of deflection system.

In the foregoing description, it was pointed out that a signal is derived from the base electrode circuit of the frequency divider stage 48 which is then amplified and compared with a frequency standard so as to enable adjustment and control of the operating frequency of the oscillator circuit. An output signal voltage is also derived from the collector electrode of the fourth frequency divider stage 48 which is connected directly to a vertical sawtooth generator 92. The vertical sawtooth generator is designed to operate at a frequency of 60 cycles and the output thereof is also connected to the deflection system 91.

The above described system illustrates but one use of the relaxation ocsillator as provided by the present invention. It can clearly be seen from the above discussion that an efficient and stable circuit is provided in accordance with the invention, which operates as a frequency divider or oscillator and which is adapted for use in a television deflection system, in a computer system or in any other manner where a frequency divider or oscillator is useful. It will also be evident that the relaxation oscillator as provided by this invention may be utilized as a sawtooth generator in the vertical or horizontal deflection system of a television receiver. For whatever use it may be adapted, it will be seen from the foregoing description of two embodiments of the invention that a transistor relaxation oscillator circuit constructed in accordance therewith may be stable and efficient in operation and may readily be adjusted to provide a sawtooth output signal wave, pulse output signal wave or a combination of pulse and sawtooth output signal waves. The oscillator circuit is also capable of stable operation with a large variation of supply voltage. The circuit, furthermore, is easily synchronized with an input signal to provide stable frequency dividing operation with transistors having a variety of characteristics.

What is claimed is:

1. A relaxation oscillator circuit, comprising in combination, a semi-conductor device including an emitter electrode, a base electrode and a collector electrode, means for applying operating potentials to said electrodes, an impedance element connected with said emitter electrode, and a storage element connected between said collector electrode and an intermediate point on said impedance element.

2. A relaxation oscillator circuit, comprising in combination, a semi-conductor device including an emitter electrode, a base electrode and a collector electrode, means for applying operating potentials to said electrodes, an impedance element connected between said emitter electrode and a point of fixed reference potential, and a storage element connected between said collector electrode and an intermediate point on said impedance element, thereby to control the operating frequency of said circuit.

3. A relaxation oscillator circuit, comprising in combination, a semi-conductor device including an emitter electrode, a base electrode and a collector electrode, means for applying operating potentials to said electrodes, a first resistor and a second resistor connected in series arrangement between said emitter electrode and a point of fixed reference potential, and a capacitor connected between said collector electrode and the junction of said first resistor and said resistor, thereby to control the frequency of oscillation of said circuit.

4. A relaxation oscillator circuit, comprising in combination, a semi-conductor device including an emitter electrode, a base electrode and a collector electrode, means for applying operating potentials to said electrodes, means providing a source of voltage for biasing said electrodes and a first impedance element connected in series arrangement between said collector electrode and a point of fixed reference potential, a second impedance element connected between said base electrode and said point of fixed reference potential, a third impedance element connected in two sections between said emitter electrode and said point of fixed reference potential, and a storage element connected between said collector electrode and an intermediate point on said third impedance element between said sections.

5. A relaxation oscillator circuit, comprising in combination, a semi-conductor device including an emitter electrode, a base electrode and a collector electrode, means for applying operating potentials to said electrodes, means providing a source of voltage for biasing said electrodes and a first resistor means connected in series arrangement between said collector electrode and ground, a second resistor means connected between said base electrode and ground, a third resistor means connected between said emitter electrode and ground, and a capacitor connected between said collector electrode and an intermediate point on said third resistor means.

6. A relaxation oscillator circuit, comprising in combination, a semi-conductor device including an emitter electrode, a base electrode and a collector electrode, means for applying operating potentials to said electrodes, means for impressing trigger pulses on one of said electrodes, means providing a source of voltage for biasing said electrodes and a first impedance element connected in series arrangement between said collector electrode and ground, a second impedance element connected between said base electrode and ground, a third impedance element connected between said emitter electrode and ground, and a storage capacitor connected between the collector electrode and an intermediate point on said third impedance element.

7. A semi-conductor relaxation oscillator circuit, comprising in combination, a semi-conductor device including a semi-conductive body, a base electrode, a collector electrode and an emitter electrode in contact with said body, means providing a source of voltage for biasing said base electrode and said collector electrode in a relatively non-conducting polarity and for normally biasing said base electrode and said emitter electrode in a relatively conducting polarity, a first resistor connected between said source and said collector electrode, a second resistor connected between said base electrode and a point of fixed reference potential, a third resistor effectively coupled with and common to both said base electrode and said collector electrode, and a storage element connected between said collector electrode and an intermediate point on said third resistor.

8. A semi-conductor relaxation oscillator circuit, comprising in combination, a semi-conductor device including a semi-conductive body, a base electrode, a collector electrode and an emitter electrode in contact with said body, means providing a source of voltage for biasing said base electrode and said collector electrode in a relatively non-conducting polarity and for normally biasing said base electrode and said emitter electrode in a relatively conducting polarity, a first impedance element connected between said source and said collector electrode, a second impedance element connected between said base electrode and a point of fixed reference potential, a feedback impedance element effectively coupled with and common to both said base electrode and said collector electrode, and a storage element connected between said collector electrode and an intermediate point on said feedback impedance element.

9. A semi-conductor relaxation oscillator circuit, comprising in combination, a semi-conductor device including a semi-conductive body, a base electrode, a collector electrode and an emitter electrode in contact with said body, a source of voltage for biasing said base electrode and said collector electrode in a relatively non-conducting polarity and for normally biasing said base electrode and said emitter electrode in a relatively conducting polarity, a load resistor connected between said source and said collector electrode, a base resistor connected between said base electrode and ground, a current limiting resistor and a feedback resistor connected in series between said emitter electrode and ground, and a capacitor connected between said collector electrode and the junction of said current limiting resistor and said feedback resistor.

10. A semi-conductor relaxation oscillator circuit, comprising in combination, a semi-conductor device including a semi-conductive body, a base electrode, a collector electrode and an emitter electrode in contact with said body, a source of voltage for biasing said base electrode and said collector electrode in a relatively non-conducting polarity and for normally biasing said base electrode and said emitter electrode in a relatively conducting polarity, means for impressing trigger pulses on one of said electrodes, a load resistor connected between said source and said collector electrode, a base resistor connected between said base electrode and ground, a current limiting resistor and a feedback resistor connected in series between said emitter electrode and ground, and a capacitor connected between said collector electrode and the junction of said current limiting resistor and said feedback resistor.

11. A semi-conductor pulse generator circuit, comprising in combination, a semi-conductor device including a semi-conductive body, a base electrode, a collector electrode and an emitter electrode in contact with said body, means providing a source of voltage for applying a reverse bias between said collector electrode and said base electrode and for normally applying a forward bias between said emitter electrode and said base electrode, a first resistor having a predetermined resistance and being connected between said source and said collector electrode, a second resistor connected between said base electrode and ground, a third resistor and a fourth resistor connected in series between said emitter electrode and ground, said fourth resistor having a resistance which is substantially less than the predetermined resistance of said first resistor, and a storage capacitor connected between the collector electrode and the junction of said third and said fourth resistor whereby said circuit cyclically provides a sawtooth signal output wave.

12. A semi-conductor pulse generator circuit, comprising in combination, a semi-conductor device including a semi-conductive body, a base electrode, a collector electrode and an emitter electrode in contact with said body, a source of voltage for applying a reverse bias between said collector electrode and said base electrode and for normally applying a forward bias between said emitter electrode and said base electrode, a first resistor having a predetermined resistance and being connected between said source and said collector electrode, a second resistor connected between said base electrode and a point of fixed reference potential, a third resistor and a fourth resistor connected in series arrangement between said emitter electrode and said point of fixed reference potential, said fourth resistor having a resistance which is substantially equal to the resistance of said first resistor, and a storage capacitor connected between said collector electrode and the junction of said third and said fourth resistors, whereby said circuit cyclically provides an output signal wave which is a combination of a pulse and a sawtooth, each having substantially equal amplitude.

13. A semi-conductor pulse generator circuit, comprising in combination, a semi-conductor device including a semi-conductive body, a base electrode, a collector electrode and an emitter electrode in contact with said body, a source of voltage for applying a reverse bias between said collector electrode and said base electrode and for normally applying a forward bias between said emitter electrode and said base electrode, a first resistor having a predetermined resistance and being connected between said source and said collector electrode, a base resistor connected between said base electrode and ground, a current limiting resistor and a feedback resistor connected in series between said emitter electrode and ground, said feedback resistor having a resistance which is substantially greater than the resistance of said first resistor, and a storage capacitor connected between the collector electrode and the junction of said current limiting resistor and said feedback resistor, whereby said circuit cyclically produces a pulse signal output wave.

14. A semi-conductor pulse generator circuit, comprising in combination, a semi-conductor device including a semi-conductive body, a base electrode, a collector electrode and an emitter electrode in contact with said body, a source of voltage for applying a reverse bias between said collector electrode and said base electrode and for normally applying a forward bias between said emitter electrode and said base electrode, means for impressing trigger pulses on said base electrode, a load resistor having a predetermined resistance and being connected between said source and said collector electrode, a base resistor connected between said base electrode and a point of fixed reference potential, a current limiting resistor and a feedback resistor connected in series arrangement between said emitter electrode and said point of fixed reference potential, said feedback resistor having a resistance which is substantially less than the resistance of said load resistor, and a storage capacitor connected between the collector electrode and the junction of said current limiting resistor and said feedback resistor.

15. A semi-conductor pulse generator circuit, comprising in combination, a semi-conductor device including a semi-conductive body, a base electrode, a collector electrode and an emitter electrode in contact with said body, a source of voltage for applying a reverse bias between said collector electrode and said base electrode and for normally applying a forward bias between said emitter electrode and said base electrode, means for impressing trigger pulses on said base electrode, a load resistor having a predetermined resistance and being connected between said source and said collector electrode, a base resistor connected between said base electrode and a point of fixed reference potential, a current limiting resistor and a feedback resistor connected in series arrangement between said emitter electrode and said point of fixed reference potential, said feedback resistor having a resistance which is substantially equal to the resistance of said load resistor, and a storage capacitor connected between the collector electrode and the junction of said current limiting resistor and said feedback resistor.

16. A semi-conductor pulse generator circuit, comprising in combination, a semi-conductor device including a semi-conductive body, a base electrode, a collector electrode and an emitter electrode in contact with said body, a source of voltage for applying a reverse bias between said collector electrode and said base electrode and for normally applying a forward bias between said emitter electrode and said base electrode, means for impressing trigger pulses on said base electrode, a load resistor having a predetermined resistance and being connected between said source and said collector electrode, a base resistor connected between said base electrode and a point of fixed reference potential, a current limiting resistor and a feedback resistor connected in series arrangement between said emitter electrode and said point of fixed reference potential, said feedback resistor having a resistance which is substantially greater than the resistance of said load resistor, and a storage capacitor connected between the collector electrode and the junction of said current limiting resistor and said feedback resistor.

References Cited in the file of this patent

UNITED STATES PATENTS

| | | |
|---|---|---|
| 2,533,001 | Eberhard | Dec. 5, 1950 |
| 2,570,939 | Goodrich | Oct. 9, 1951 |
| 2,662,178 | Levell | Dec. 8, 1953 |
| 2,681,411 | Washburn | June 15, 1954 |

OTHER REFERENCES

"Some Novel Circuits for the Three Terminal Semi-conductor Amplifier," by Webster, Eberhard and Barton; RCA Review, March 1949, pages 14–16 relied on.